(12) United States Patent
Reber et al.

(10) Patent No.: US 10,008,447 B2
(45) Date of Patent: Jun. 26, 2018

(54) SOLAR CELL POWERED INTEGRATED CIRCUIT DEVICE AND METHOD THEREFOR

(71) Applicant: FREESCALE SEMICONDUCTOR, INC., Austin, TX (US)

(72) Inventors: Douglas M. Reber, Austin, TX (US); Mehul D. Shroff, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days. days.

(21) Appl. No.: 14/718,168

(22) Filed: May 21, 2015

(65) Prior Publication Data
US 2016/0343696 A1    Nov. 24, 2016

(51) Int. Cl.
| | |
|---|---|
| *H01L 31/02* | (2006.01) |
| *H01L 31/18* | (2006.01) |
| *H01L 21/768* | (2006.01) |
| *H01L 31/053* | (2014.01) |
| *H01L 27/142* | (2014.01) |
| *H01L 23/528* | (2006.01) |
| *H01L 31/042* | (2014.01) |
| *H01L 31/0224* | (2006.01) |

(Continued)

(52) U.S. Cl.
CPC ...... *H01L 23/528* (2013.01); *H01L 21/76898* (2013.01); *H01L 23/481* (2013.01); *H01L 25/165* (2013.01); *H01L 27/142* (2013.01); *H01L 31/02008* (2013.01); *H01L 31/022441* (2013.01); *H01L 31/042* (2013.01); *H01L 21/76805* (2013.01)

(58) Field of Classification Search
CPC .......... H01L 31/022441; H01L 31/042; H01L 27/142; H01L 23/481; H01L 23/528
See application file for complete search history.

(56) References Cited

U.S. PATENT DOCUMENTS

| | | | |
|---|---|---|---|
| 8,338,939 B2 | 12/2012 | Lin et al. | |
| 8,883,541 B2 * | 11/2014 | Chen ................. | H01L 21/26506 257/506 |

(Continued)

FOREIGN PATENT DOCUMENTS

WO    2013075947 A1    5/2013

OTHER PUBLICATIONS

Warneke et al, "An autonomous 16 mm3 solar-powered node for distributed wireless sensor networks", Proceedings of IEEE Sensors, 2002, pp. 1510-1515, vol. 2.

(Continued)

*Primary Examiner* — Victor A Mandala
*Assistant Examiner* — Regan J Rundio

(57) ABSTRACT

A semiconductor device includes a circuitry die and a solar cell die. The circuitry die includes a plurality of interconnect layers on a front side of the circuitry die, a metallization layer on a back side of the circuitry die, and at least one TSV (through substrate via) that makes an electrical connection between a last metal interconnect layer on the front side of the circuitry die and the metallization layer on the back side of the circuitry die. The solar cell die is configured to power the circuitry die. The solar cell die includes a transparent contact on a front side of the solar cell die. A back side of the solar cell die is attached to the back side of the circuitry die and makes electrical contact with the metallization layer on the back side of the circuitry die.

18 Claims, 7 Drawing Sheets

(51) Int. Cl.
*H01L 23/48* (2006.01)
*H01L 25/16* (2006.01)

(56) References Cited

U.S. PATENT DOCUMENTS

| | | | | |
|---|---|---|---|---|
| 8,906,779 | B2* | 12/2014 | Bedell | H01L 27/142 257/21 |
| 8,969,992 | B2* | 3/2015 | Bedell | H01L 31/02008 257/459 |
| 9,219,187 | B2* | 12/2015 | Bedell | H01L 27/142 |
| 2010/0212741 | A1* | 8/2010 | Lin | H01L 31/0547 136/259 |
| 2012/0032291 | A1* | 2/2012 | Regnier | H01L 25/16 257/433 |
| 2012/0126298 | A1* | 5/2012 | Chen | H01L 27/0688 257/290 |
| 2013/0260505 | A1* | 10/2013 | Bedell | H01L 27/142 438/67 |
| 2013/0277810 | A1 | 10/2013 | Tan et al. | |
| 2014/0035155 | A1* | 2/2014 | Tan | H01L 23/58 257/774 |
| 2015/0200311 | A1* | 7/2015 | Bredel | H01L 31/02008 136/256 |
| 2015/0228584 | A1* | 8/2015 | Huang | H01L 23/5384 257/774 |

OTHER PUBLICATIONS

Bellew et al, "An SOI process for fabrication of solar cells, transistors and electrostatic actuators', 12th International Conference on Transducers, Solid-State Sensors, Actuators and Microsystems", Jun. 8-12, 2003, pp. 1075-1078, vol. 2.

Zahler et al, "Wafer bonding and layer transfer processes for 4-junction high efficiency solar cells", Conference Record of the Twenty-Ninth IEEE Photovoltaic Specialists Conference, May 19-24, 2002, pp. 1039-1042.

Baliga, "Looking for new ways to make ultrafast chips, designers explore the third dimension", Chips Go Vertical, IEEE Spectrum, Mar. 2004, pp. 43-47.

Aspar et al, "Smart-Cut(R) process using metallic bonding: Application to transfer of Si, GaAs, InP thin films", Electronic Letters, Jun. 10, 1999, pp. 1024-1025, vol. 35, Issue 12.

Soitec, "Soitec leverages SmartCut TM technology to produce advanced Silocon-on-Insulator (SOI) substrates and innovative structures", www.soitec.com/en/technologies/smart-cut, Apr. 4, 2011, pp. 1-2, last retrieved Aug. 20, 2015.

Soitec, "Soitec_SmrtCut_EN.pdf", www.soitec.com/pdf/Soitec_SmartCut_EN.pdf, Apr. 4, 2011, p. 1, last retrieved Aug. 20, 2015.

* cited by examiner

US 10,008,447 B2

SOLAR CELL POWERED INTEGRATED CIRCUIT DEVICE AND METHOD THEREFOR

BACKGROUND

Field

This disclosure relates generally to solar cells and more particularly to solar cells mounted on substrates.

Related Art

Solar cells have been particularly useful in using sunlight as a source of electrical energy thereby avoiding typical energy sources that are carbon-based. Another use of solar cells is where these typical energy sources are not available or are inconvenient. Some of these uses include using solar cells as a power source for integrated circuits. This has the effect of increasing the desirability of solar cells that are smaller and can connect with other devices that are small.

Accordingly there is a need to provide further improvement in associating solar cells with integrated circuits.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a solar cell is combined with an electrical circuit formed on a semiconductor wafer. The solar cell has one terminal connected to an interface between the solar cell and the electrical circuit in which the interface functions to stop an etch forming a through-substrate via (TSV) through the semiconductor wafer. This is better understood by reference to the drawings and the following written description.

The semiconductor substrate described herein can be any semiconductor material or combinations of materials, such as gallium arsenide, silicon germanium, silicon-on-insulator (SOI), silicon, monocrystalline silicon, the like, and combinations of the above.

Figure 1:
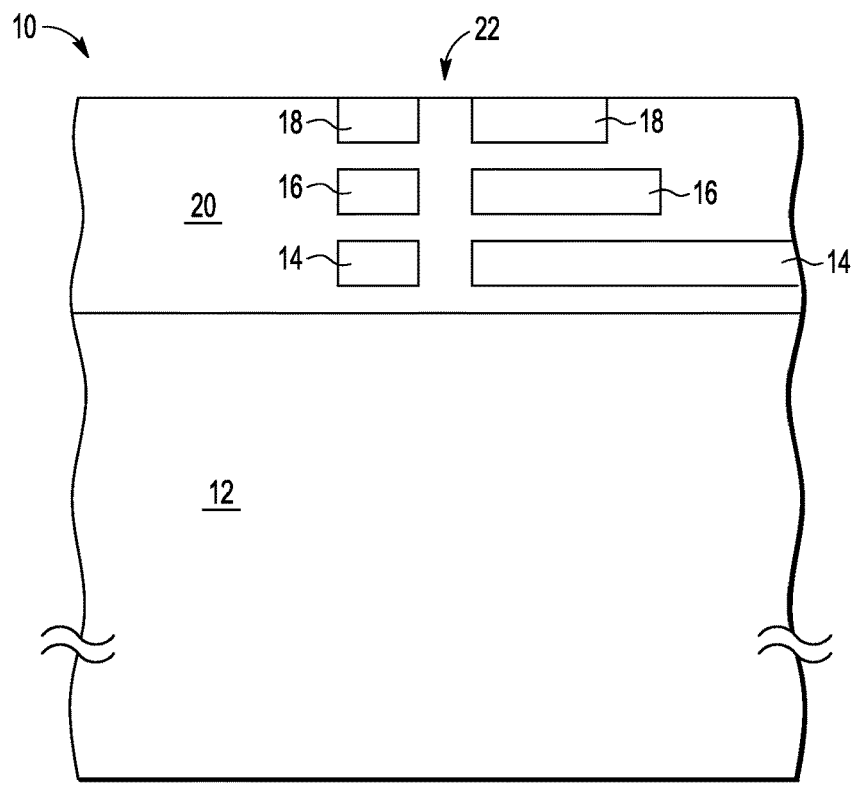
FIG. 1 is a cross section of structure of a semiconductor die that is useful in combining electrical circuit functionality and solar cell functionality.

FIG. 1 is a semiconductor device 10 having a wafer 12, a metal interconnect 14 in a first metal layer, a metal interconnect 16 in a second metal layer that is formed after the first metal layer, a metal interconnect 18 in a third metal layer that is formed after the second metal layer. An interlayer dielectric (ILD) 20 is surrounds metal interconnects 14, 16, and 18. An opening 22 is present in metal interconnects 14, 16, and 18. Opening 22 is substantially vertical with respect to a top surface of wafer 12. Wafer 12 may contain multiple integrated circuits. A portion of one such integrated circuit is shown in FIG. 1. Metal interconnects 14, 16, and 18 are for that one such integrated circuit. Other interconnects of the same design, not shown in FIG. 1, are for other integrated circuits that use wafer 12. Interconnects are 14, 16, and 18 are circuitry. Circuitry also includes transistors formed using wafer 12. An individual integrated circuit of wafer 12 may be referenced as a circuitry die. Some examples of the circuitry are energy storage capacitors, antenna circuitry, data collection circuitry, and connections for making external connections to external data collection circuitry. Further, there may be additional metal layers and other circuit elements for each integrated circuit using wafer 12. Generally, it is desirable for metal interconnects to be of the same material, such as copper, but that is not necessarily the case. Metal interconnects would typically be made of a similar thickness but they could also vary substantially. ILD 20 may be oxide but could also include other materials. ILD 20 may be formed in a plurality of layers and subjected to etches helping in forming interconnects 14, 16, and 18. Metal interconnects 14, 16, and 18 may be referenced as a plurality of interconnect layers.

Figure 2:
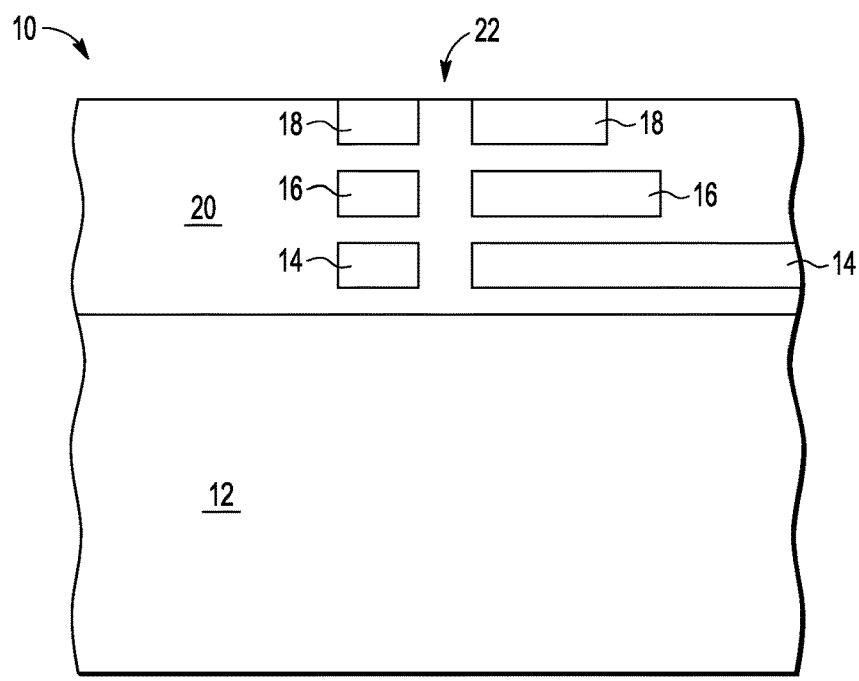
FIG. 2 is a cross section of the structure of FIG. 1 at a subsequent stage in processing.

Shown in FIG. 2 is semiconductor device 10 performing thinning of wafer 12. This is a common practice performed on wafers that is typically achieved by grinding and etching. The resulting thickness of wafer 12 may be 30 microns. This thickness can vary, and is especially likely to become thinner as wafer handling continues to improve. The total thickness can be less than 100 microns at this stage shown in FIG. 2.

Figure 3:
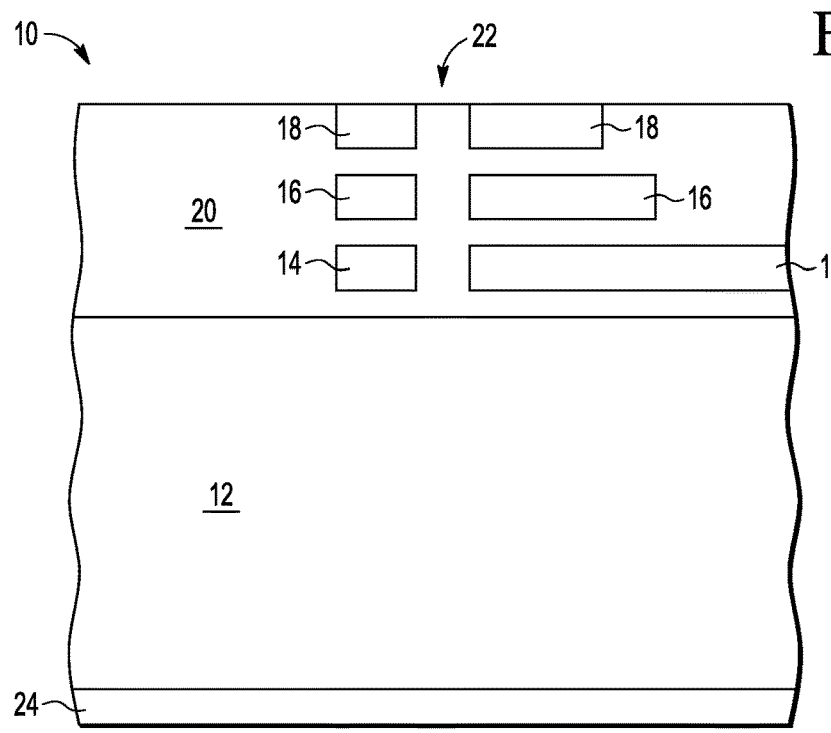
FIG. 3 is a cross section of the structure of FIG. 2 at a subsequent stage in processing.

Shown in FIG. 3 is semiconductor device 10 after forming a conductive layer 24 on a bottom surface of wafer 12. This could be the same metal type as one or more of metal interconnects 14, 16, and 18 or some other metal type. The thickness may be similar to the thickness of an interconnect layer such as a metal interconnects 14, 16, or 18. It may also vary in thickness from these interconnects. Conductive layer 24 may be referenced as a metallization layer. The bottom surface of wafer 12 may be referenced as the back side of wafer 12 and the opposite side as the front side.

Figure 4:
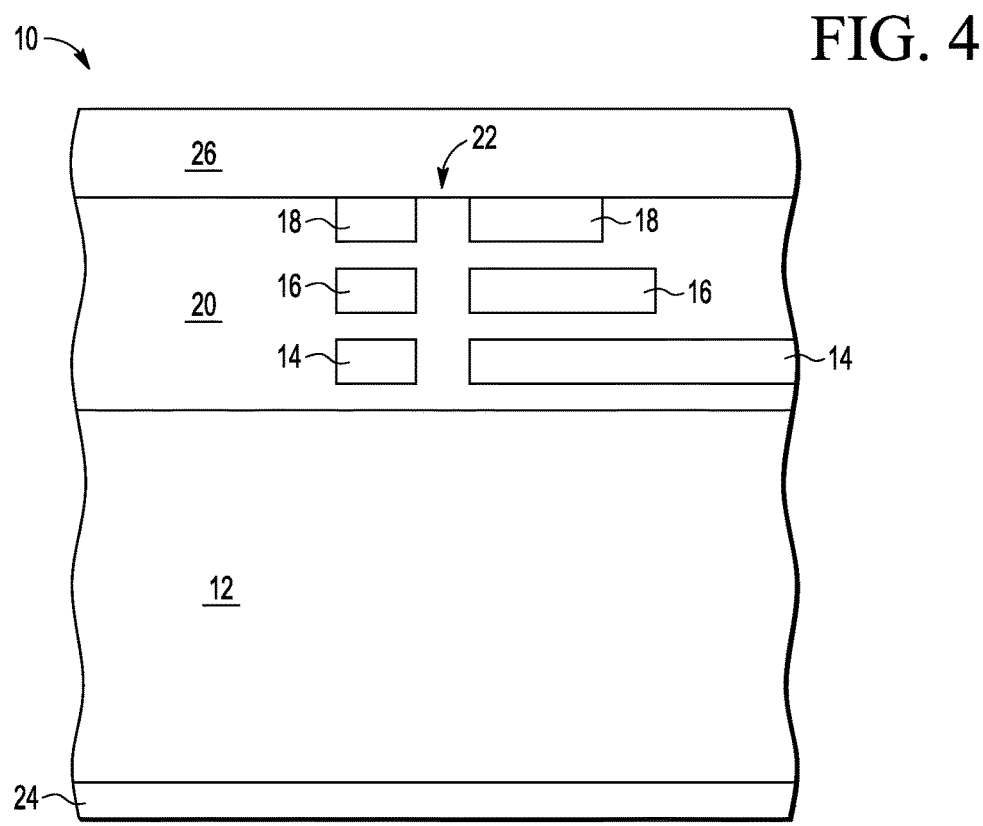
FIG. 4 is a cross section of the structure of FIG. 3 at a subsequent stage in processing.

Shown in FIG. 4 is semiconductor device 10 after forming a dielectric layer 26 over dielectric layer 20, metal interconnect 18, and opening 22.

Figure 5:
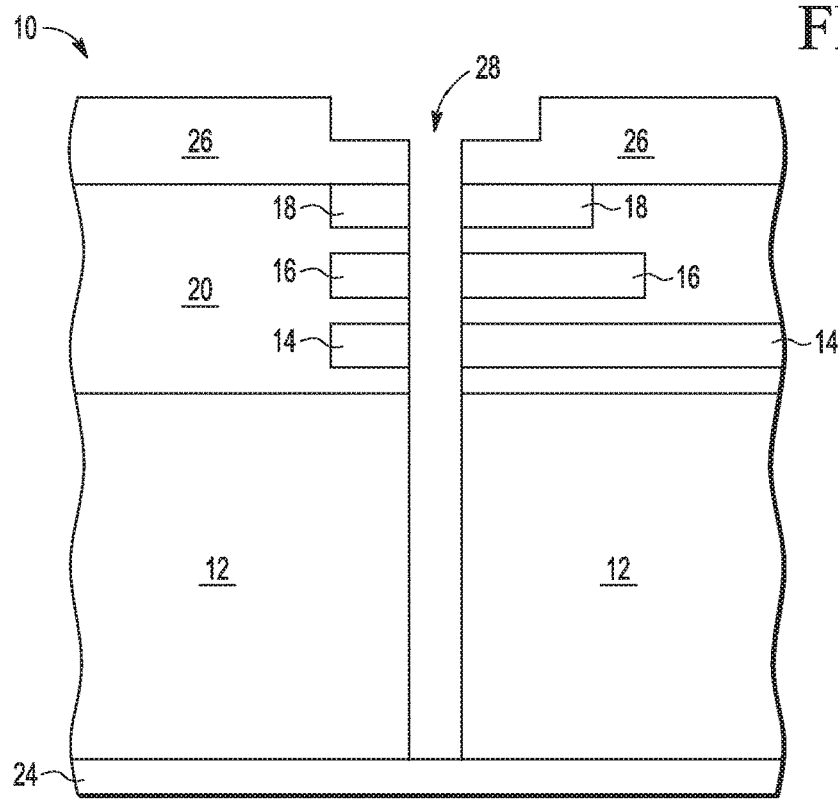
FIG. 5 is a cross section of the structure of FIG. 4 at a subsequent stage in processing.

Shown in FIG. 5 is semiconductor device 10 after forming an opening 28 by forming an opening partially through dielectric layer 26 that is substantially centered over but larger than opening 22, removing ILD 20 from opening 22, and etching through wafer 12 to conductive layer 24. In this case, opening 28 is formed so that sides of metal interconnects 14, 16, and 18 are exposed.

Figure 6:
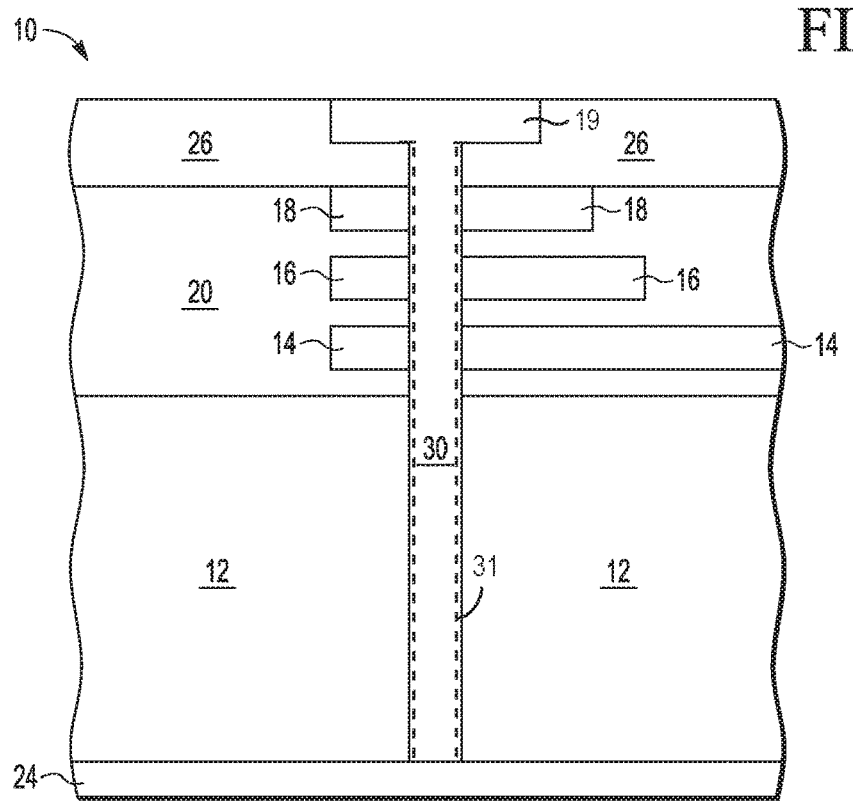
FIG. 6 is a cross section of the structure of FIG. 5 at a subsequent stage in processing.

Shown in FIG. 6 is semiconductor device 10 forming a metal plug 30, as part of the last metal interconnect layer 19, in opening 28 that extends to conductive layer 24. In this case, plug 30 contacts wafer 12 and interconnects 14, 16, and 18. An insulating sidewall liner (shown as dashed outline 31) could be used to prevent plug 30 from contacting interconnects 14, 16, and 18 and wafer 12.

Figure 7:
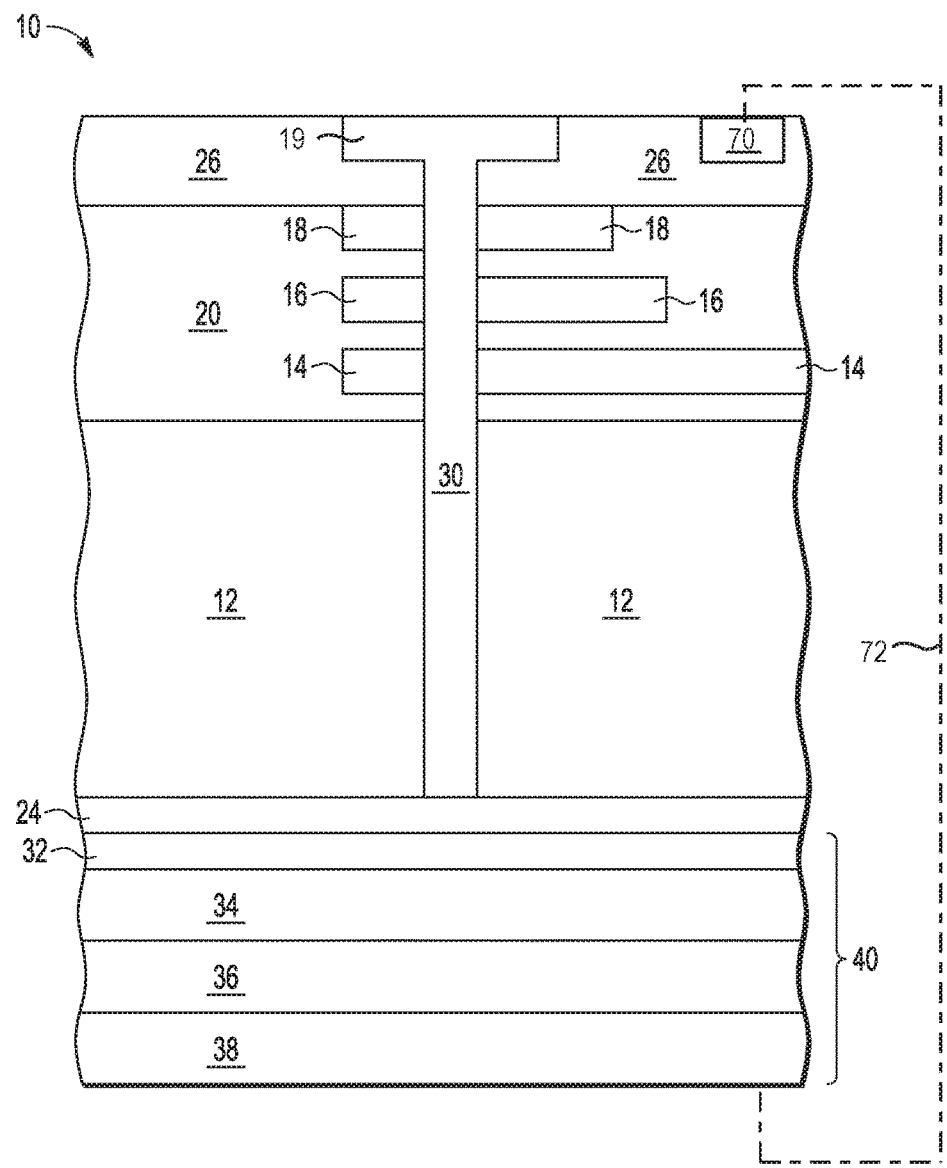
FIG. 7 is a cross section of the structure of FIG. 6 at a subsequent stage in processing.

Shown in FIG. 7 is semiconductor device after attaching a solar cell 40 to conductive layer 24. There would a different solar cell for each integrated circuit of wafer 12. Solar cell 40 has a conductive layer 32 in contact with conductive layer 24, a semiconductor layer 34 of a first conductivity type in contact with conductive layer 32, a semiconductor layer 36 of a second conductivity type in contact with semiconductor layer 34, and conductive layer 38 in contact with semiconductor layer 36. In some embodiments, a contacting portion of semiconductor layer 34 in contact with conductor 32 may be silicided. In this example, conductive layer 32 is intended to be the negative contact, typically ground, so that the first conductivity type is N-type and the second conductivity type is P-type. Both semiconductor layers 34 and 36 may be heavily doped. Conductive layer 32 is opaque and may be cobalt, nickel, aluminum and potentially other materials. Conductive layer 38 is transparent and is desirably highly conductive for use as an electrical contact and thus referenced as the transparent contact. It may be indium-doped tin oxide, doped zinc oxide, or another transparent material that is conductive. The semiconductor device and solar cell may be bonded in wafer form or in singulated die form. Solar cell 40 may be one of or replaced by one of a plurality of crystalline silicon solar cells, monocrystalline silicon solar cells, amorphous silicon solar cells, thin film solar cells, single-junction solar cells, and multi-junction solar cells.

Solar cell 40, when receiving light, develops a voltage differential that may be coupled from conductive layer 38 to circuitry above conductive layers 24 and 32. This may achieved by wiring but this is a difficult process. An alternative is to provide another TSV but this time to conductive layer 38.

Figure 8:
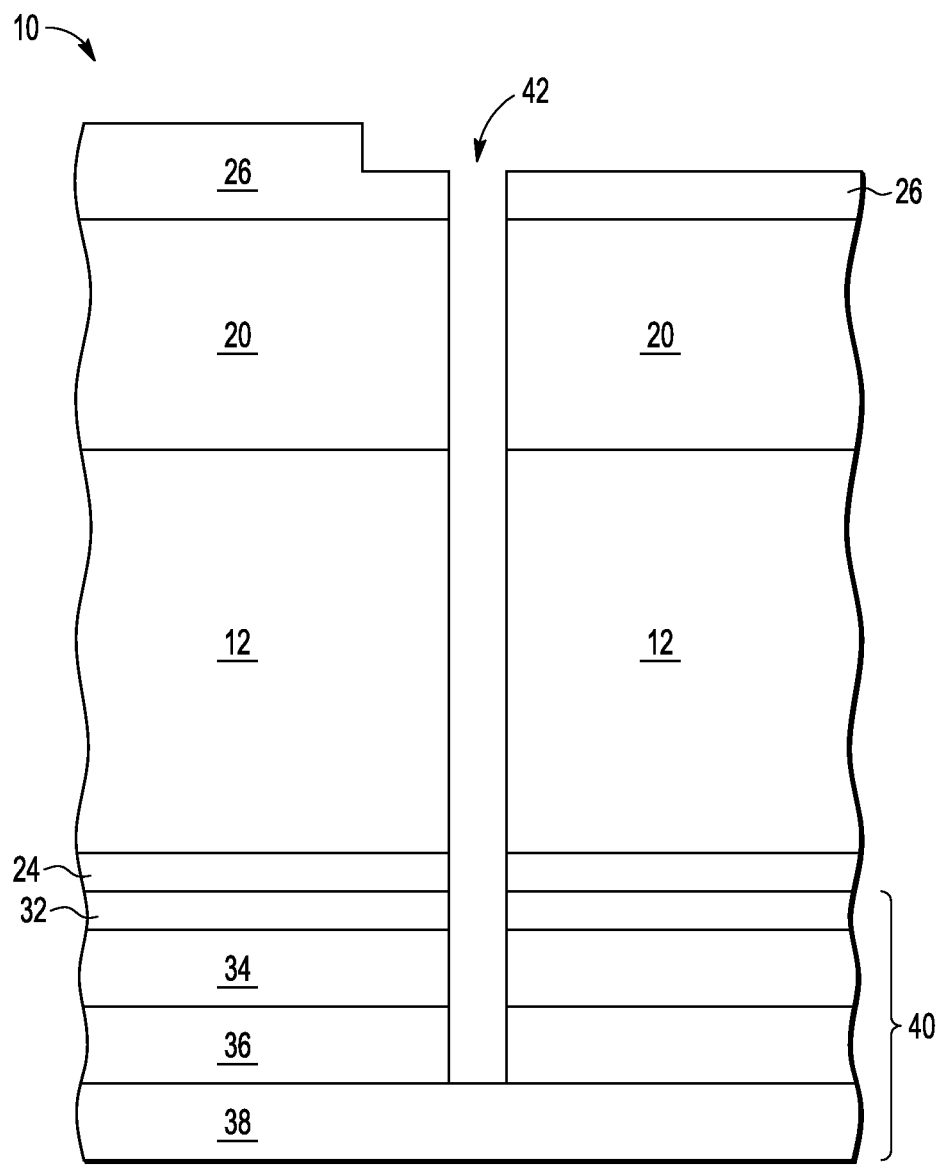
FIG. 8 is a cross section of a structure at a subsequent stage in processing to that of FIG. 7 at a different location from that of FIG. 7 but on the same die.

Shown in FIG. 8 is semiconductor device 10 further showing an opening 42 through layer 26, ILD 20, conductive layers 24 and 32, and semiconductor layers 34 and 36 and stopping on conductive layer 38. This liner etch may also remove the liner from the bottom portion of the trench in dielectric 26. Surrounding opening 42 is an opening that extends partially through dielectric 26.

Figure 9:
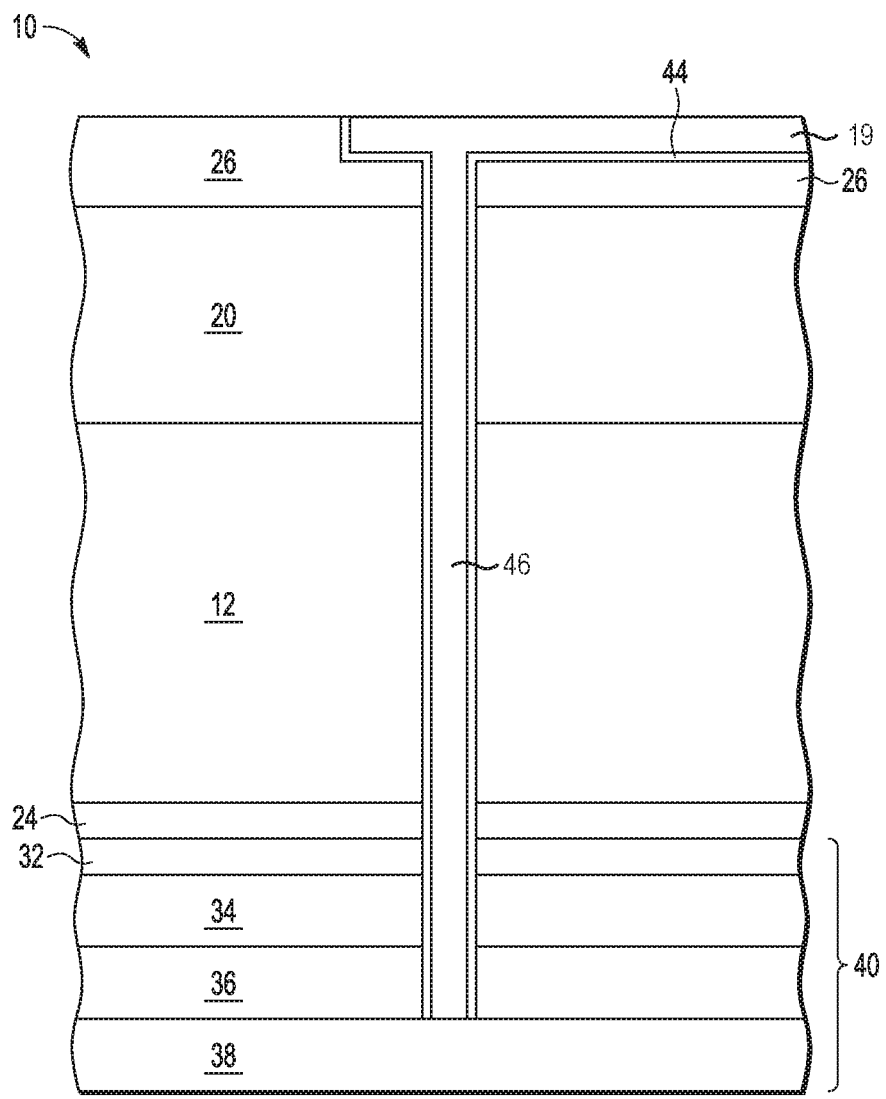
FIG. 9 is a cross section of the structure of FIG. 8 at a subsequent stage in processing.

Shown in FIG. 9 is semiconductor device 10 after forming a liner 44 in opening 42 and the surrounding opening. After forming liner 44, an etch is performed to remove liner 44 from conductive layer 38. After this etch, a conductive fill 46 is formed in opening 42 and the surrounding opening. Liner 44 prevents conductive fill 46 from contacting wafer 12, conductive layers 24 and 32, and semiconductor layers 34 and 36. It may be advantageous for opening 42 to extend partially into conductive layer 38. Conductive fill 46 can be extended as desired to circuitry in ILD 20. Conductive fill 46 may be an inlaid metallization requiring a chemical mechanical polish, it may be electroplated using conductive layer 38 as an electrode, or it may be an additive metal deposition defined by some other means such as lithography and etch. Conductive fill 46 is thus a TSV that makes electrical contact between the top or last metal layer 19 and the transparent contact.

Figure 10:
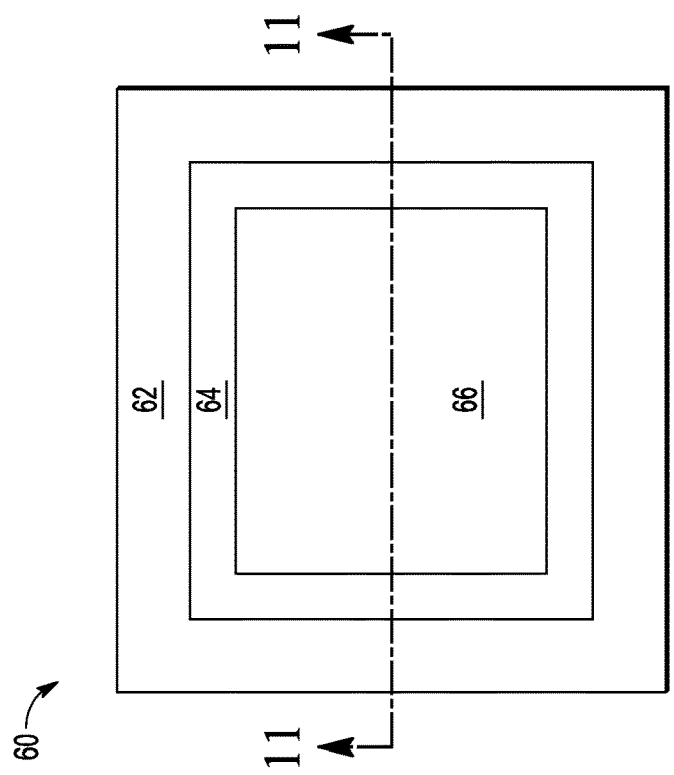
FIG. 10 is a top view of a package useful for an integrated circuit having a solar cell such as that shown in FIGS. 7 and 9.

Shown in FIG. 10 is a package 60 having a carrier 62, a cap 64 having a window 66. The transparent contact, conductive layer 38, would be exposed through window 66 that is useful for an integrated circuit having a solar cell.

Figure 11:
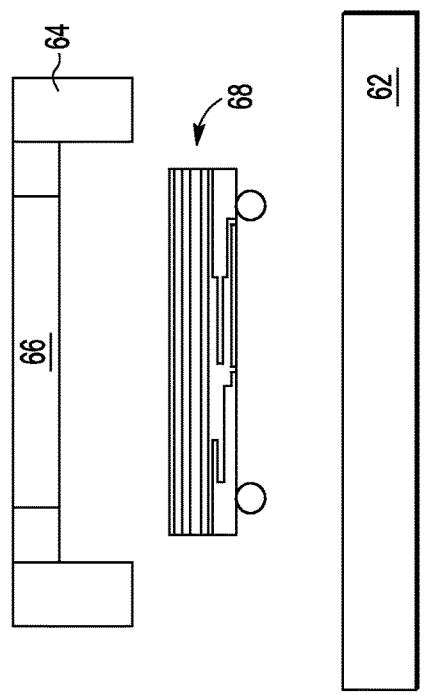
FIG. 11 is a cross section of the package of FIG. 10 with the integrated circuit having the solar cell.

Shown in FIG. 11 is a cross section 11-11 of package 60 as shown in FIG. 10. This shows an exemplary integrated circuit die 68 from semiconductor device 10 that is mounted on carrier 62. The side of the die mounted on carrier 62 would be the side of the die having the circuitry 66. Cap 64 is mounted on carrier 62 resulting in the solar cell being exposed through window 66. Window 66 can be less than 1 square centimeter.

Thus it is seen that a solar cell can be efficiently employed in combination with an integrated circuit to power the integrated circuit using TSV technology. The result can thus be a package having a window to the transparent contact on the front side of the of the solar cell die and contact the circuitry die with an interior surface of the package. The package can have a top surface area smaller than one square centimeter.

By now it is apparent that there has been described embodiments of semiconductor devices that include circuitry powered by a solar cell and methods for making such semiconductor devices. In one embodiment of the present disclosure, a semiconductor device is provided, which includes a circuitry die that includes a plurality of interconnect layers on a front side of the circuitry die, a metallization layer on a back side of the circuitry die, and at least one TSV (through silicon via) that makes an electrical connection between a last metal interconnect layer on the front side of the circuitry die and the metallization layer on the back side of the circuitry die. The semiconductor device also includes a solar cell die configured to power the circuitry die, the solar cell die including a transparent contact on a front side of the solar cell die, where a back side of the solar cell die is attached to the back side of the circuitry die and makes electrical contact with the metallization layer on the back side of the circuitry die.

One aspect of the above embodiment provides that the semiconductor device further includes a connection external to the circuitry die between the transparent contact of the solar cell die and a contact on the front side of the circuitry die.

Another aspect of the above embodiment provides that the semiconductor device further includes at least one power TSV that makes an electrical connection between the last metal interconnect layer on the front side of the circuitry die and the transparent contact on the front side of the solar cell die.

Another aspect of the above embodiment provides that the semiconductor device further includes a package having a window, where the circuitry die is attached to an interior surface of the package, and the solar cell die is exposed to light through the window.

A further aspect of the above embodiment provides that the package has a surface area smaller than one square centimeter.

Another aspect of the above embodiment provides that the at least one TSV makes electrical contact with at least one of the plurality of interconnect layers.

Another aspect of the above embodiment provides that the at least one TSV includes a non-conductive liner that insulates the TSV from the plurality of interconnect layers.

Another aspect of the above embodiment provides that the circuitry die is less than 100 microns thick.

Another aspect of the above embodiment provides that the circuitry die further comprises an energy storage capacitor.

Another aspect of the above embodiment provides that the circuitry die further comprises antenna circuitry.

Another aspect of the above embodiment provides that the circuitry die further comprises data collection circuitry.

Another aspect of the above embodiment provides that the circuitry die further comprises external connections configured to be connected to external data collection circuitry.

Another aspect of the above embodiment provides that the solar cell die comprises at least one of a group including crystalline silicon solar cells, monocrystalline silicon solar cells, amorphous silicon solar cells, thin film solar cells, single-junction solar cells, and multi-junction solar cells.

In another embodiment of the present disclosure, a semiconductor device is provided, including a circuitry die that includes a plurality of interconnect layers on a front side of the circuitry die, and a metallization layer on a back side of the circuitry die. The semiconductor device also includes a solar cell die configured to power the circuitry die, the solar cell die including a transparent contact on a front side of the solar cell die, where a back side of the solar cell die is attached to the back side of the circuitry die and makes electrical contact with the metallization layer on the back side of the circuitry die; and at least one power TSV (through silicon via) that makes an electrical connection between a last metal interconnect layer on the front side of the circuitry die and the transparent contact on the front side of the solar cell die.

One aspect of the above embodiment provides that the at least one power TSV includes a non-conductive liner that insulates the at least one power TSV from the plurality of interconnect layers.

Another aspect of the above embodiment provides that the semiconductor device has a surface area smaller than one square centimeter.

Another aspect of the above embodiment provides that the semiconductor device further includes a package having a window, where the circuitry die is attached to an interior surface of the package, and the solar cell die is exposed to light through the window.

Another aspect of the above embodiment provides that the circuitry die further includes at least one ground TSV that makes an electrical connection between the last metal interconnect layer on the front side of the circuitry die and the metallization layer on the back side of the circuitry die.

In another embodiment of the present disclosure, a semiconductor device is provided, including a circuitry wafer that includes a plurality of interconnect layers on a front side of the circuitry wafer, a metallization layer on a back side of the circuitry wafer, and a plurality of TSVs (through silicon vias) that each make an electrical connection between a last metal interconnect layer on the front side of the circuitry wafer and the metallization layer on the back side of the circuitry wafer. The semiconductor device also includes a solar cell wafer including a transparent contact on a front side of the solar cell wafer, where a back side of the solar cell wafer is attached to the back side of the circuitry wafer and makes electrical contact with the metallization layer on the back side of the circuitry wafer.

One aspect of the above embodiment provides that the semiconductor device further includes a plurality of power TSVs that each make an electrical connection between the last metal interconnect layer on the front side of the circuitry wafer and the transparent contact on the front side of the solar cell wafer.

Although the invention is described herein with reference to specific embodiments, various modifications and changes can be made without departing from the scope of the present invention as set forth in the claims below. For example, materials used may differ. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device comprising:
   a circuitry die comprising:
   a plurality of interconnect layers on a front side of the circuitry die,
   a metallization layer on a back side of the circuitry die, and
   at least one TSV (through silicon via) filled with a metal plug that contacts and extends from a portion of a last metal interconnect layer on the front side of the circuitry die to the metallization layer on the back side of the circuitry die, wherein
   the at least one TSV is surrounded by a non-conductive liner that insulates the TSV from the plurality of interconnect layers except the last metal interconnect layer; and
   a solar cell die configured to power the circuitry die, the solar cell die comprising:
   a transparent contact on a front side of the solar cell die, wherein
   a back side of the solar cell die is attached to the back side of the circuitry die and makes electrical contact with the metallization layer on the back side of the circuitry die.

2. The semiconductor device of claim 1, further comprising:
   wiring external to the circuitry die between the transparent contact of the solar cell die and a contact on the front side of the circuitry die.

3. The semiconductor device of claim 1, further comprising:
   at least one power TSV filled with a metal plug that contacts and extends from another portion of the last metal interconnect layer on the front side of the circuitry die to the transparent contact on the front side of the solar cell die.

4. The semiconductor device of claim 1, further comprising:
   a package having a window, wherein
   the circuitry die is attached to an interior surface of the package, and
   the solar cell die is exposed to light through the window.

5. The semiconductor device of claim 4, wherein
   the package has a surface area smaller than one square centimeter.

6. The semiconductor device of claim 1, wherein
   the at least one TSV makes electrical contact with at least one of the plurality of interconnect layers.

7. The semiconductor device of claim 1, wherein the circuitry die is less than 100 microns thick.

8. The semiconductor device of claim 1, wherein the circuitry die further comprises an energy storage capacitor.

9. The semiconductor device of claim 1, wherein the circuitry die further comprises antenna circuitry.

10. The semiconductor device of claim 1, wherein the circuitry die further comprises data collection circuitry.

11. The semiconductor device of claim 1, wherein the circuitry die further comprises external connections configured to be connected to external data collection circuitry.

12. The semiconductor device of claim 1, wherein the solar cell die comprises at least one of a group including crystalline silicon solar cells, monocrystalline silicon solar cells, amorphous silicon solar cells, thin film solar cells, single-junction solar cells, and multi-junction solar cells.

13. A semiconductor device comprising:
a circuitry die comprising:
 a plurality of interconnect layers on a front side of the circuitry die, and
 a metallization layer on a back side of the circuitry die; and
a solar cell die configured to power the circuitry die, the solar cell die comprising:
 a transparent contact on a front side of the solar cell die, wherein
  a back side of the solar cell die is attached to the back side of the circuitry die and makes electrical contact with the metallization layer on the back side of the circuitry die; and
at least one power TSV (through silicon via) filled with a metal plug that contacts and extends from a portion of a last metal interconnect layer on the front side of the circuitry die to the transparent contact on the front side of the solar cell die, wherein
 the at least one power TSV is surrounded by a non-conductive liner that insulates the at least one power TSV from the plurality of interconnect layers except the last metal interconnect layer.

14. The semiconductor device of claim 13, wherein the semiconductor device has a surface area smaller than one square centimeter.

15. The semiconductor device of claim 13, further comprising:
a package having a window, wherein
 the circuitry die is attached to an interior surface of the package, and
 the solar cell die is exposed to light through the window.

16. The semiconductor device of claim 13, wherein the circuitry die further comprises:
at least one ground TSV filled with a metal plug that contacts and extends from another portion of the last metal interconnect layer on the front side of the circuitry die to the metallization layer on the back side of the circuitry die.

17. A semiconductor device comprising:
a circuitry wafer comprising:
 a plurality of interconnect layers on a front side of the circuitry wafer,
 a metallization layer on a back side of the circuitry wafer, and
 a plurality of TSVs (through silicon vias) each filled with a metal plug that contacts and extends from a respective portion of a last metal interconnect layer on the front side of the circuitry wafer to the metallization layer on the back side of the circuitry wafer; and
a solar cell wafer comprising:
 a transparent contact on a front side of the solar cell wafer, wherein
  a back side of the solar cell wafer is attached to the back side of the circuitry wafer and makes electrical contact with the metallization layer on the back side of the circuitry wafer.

18. The semiconductor device of claim 17, further comprising:
a plurality of power TSVs each filled with a metal plug that contacts and extends from another respective portion of the last metal interconnect layer on the front side of the circuitry wafer to the transparent contact on the front side of the solar cell wafer.

* * * * *